United States Patent
Lim et al.

(10) Patent No.: US 7,368,816 B2
(45) Date of Patent: *May 6, 2008

(54) MICRO-ELECTRO-MECHANICAL SYSTEM (MEMS) PACKAGE HAVING METAL SEALING MEMBER

(75) Inventors: Ohk Kun Lim, Gyeonggi-do (KR); Suk Kee Hong, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 99 days.

This patent is subject to a terminal disclaimer.

(21) Appl. No.: 11/180,308

(22) Filed: Jul. 12, 2005

(65) Prior Publication Data

US 2006/0076670 A1    Apr. 13, 2006

(30) Foreign Application Priority Data

Oct. 8, 2004   (KR) .................. 10-2004-0080490

(51) Int. Cl.
  *H01L 23/10*   (2006.01)
(52) U.S. Cl. ................ 257/710; 257/704; 257/E23.128
(58) Field of Classification Search ................ 257/414, 257/415, 433, 710, 684, 711, 680, 704, E23.18, 257/E21.499, E21.5, E21.219, 678, E23.128
See application file for complete search history.

(56) References Cited

U.S. PATENT DOCUMENTS

| 6,303,986 | B1 | 10/2001 | Shook | |
| 7,078,804 | B2 * | 7/2006 | Hong et al. ................. | 257/730 |
| 7,102,224 | B2 * | 9/2006 | Pahl ........................... | 257/704 |

* cited by examiner

*Primary Examiner*—Howard Weiss
*Assistant Examiner*—Hoa B Trinh
(74) *Attorney, Agent, or Firm*—Christensen O'Connor Johnson Kindness PLLC

(57) ABSTRACT

A micro-electro-mechanical system (MEMS) package having a metal sealing member is disclosed. The MEMS package is formed by forming a metal layer on a substrate by patterning so that the metal layer surrounds an MEMS element provided on the substrate; joining a lid to the metal layer; providing a side sealing member on a side surface of the substrate; and covering the lid and the substrate with a metal sealing member, thus hermetically sealing the MEMS element from the external environment.

8 Claims, 2 Drawing Sheets

MICRO-ELECTRO-MECHANICAL SYSTEM (MEMS) PACKAGE HAVING METAL SEALING MEMBER

BACKGROUND OF THE INVENTION

1. Field of the Invention

The present invention relates, in general, to micro-electromechanical system (MEMS) packages with metal sealing members and methods of manufacturing the MEMS packages and, more particularly, to an MEMS package having a metal sealing member, in which an MEMS element provided on a substrate is hermetically sealed from the external environment by forming a metal layer on the substrate by patterning, or forming a spacer on the substrate so as to create an MEMS moving space in which the MEMS element is free to move vertically; joining a lid to the metal layer or the spacer; providing a side sealing member on a side surface of the lid; and covering the lid and the substrate with the metal sealing member.

2. Description of the Related Art

In recent years, high-capacity communications for broadband service, such as in the Internet or the IMT 2000, have become powerful, so that optical communication techniques including, for example, WDM (wavelength division multiplexing), have been quickly standardized. In relation to the standardization of the optical communication technique, MEMS, which does not depend on wavelength, data rate or signal format and thereby has characteristics of being "optically transparent", has been proposed and recognized as an innovative technique to supplant electronics, which can accomplish the recent trend of system smallness.

In the related art, current applications of MEMS are accelerometers, pressure sensors, inkjet heads, hard disk heads, projection displays, scanners and micro-fluidics. In recent years, interest in the techniques of optical communication elements, having higher operational performance to meet the rapid development in the optical communications field, has increased.

Particularly, the interest in the techniques of the optical communication elements is concentrated on spatial light modulators, which have a great number of micromirrors and operate in a specified switching manner such that the micromirrors are actuated by MEMS type actuators. The spatial light modulators use an optical signal processing technique with advantages in that a great amount of data can be quickly processed in a parallel manner, unlike a conventional digital information processing technique, in which a great amount of data cannot be processed in real time.

Thus, studies have been actively conducted on the design and production of binary phase only filters, optical logic gates, light amplifiers, image processing techniques, optical devices, and light modulators using the spatial light modulation theory. Of them, the spatial light modulators are applied to fields relating to optical memory units, optical display devices, printers, optical interconnections, and holograms, and studies have been conducted to develop display devices employing the spatial display modulators.

However, the MEMS elements have ultra-fine actuators so that the MEMS elements are greatly sensitive to the external environment, including temperature, humidity, micro-dust, vibration and impact, and thereby may frequently commit errors during operation, or may suddenly stop operating.

In an effort to allow the MEMS elements to effectively operate without being negatively affected by the environment, the MEMS elements have been sealed in cavities of sealed packages. U.S. Pat. No. 6,303,986 discloses a method and apparatus for sealing MEMS elements using a hermetic lid to provide an MEMS package.

Herein below, the construction of the MEMS package disclosed in U.S. Pat. No. 6,303,986, in which the lid glass hermetically seals the MEMS elements from the external environment, will be described with reference to FIG. 1.

FIG. 1 shows a representative sectional view of the MEMS package in which the transparent lid hermetically seals the MEMS element. As shown in FIG. 1, a conductive ribbon 100 having a metallic conductive/reflective covering 102 is formed over an upper surface of a semiconductor substrate 104, with an air gap 106 defined between the ribbon 100 and the substrate 104.

A conductive electrode 108 is formed on the upper surface of the substrate 104 and covered with an insulation layer 110. The conductive electrode 108 is placed under the ribbon 100 at a position under the air gap 106.

The conductive/reflective covering 102 extends beyond the region of the mechanically active ribbon 100 and is configured as a bond pad 112 at its distal end. The MEMS package is also passivated with a conventional overlying insulating passivation layer 114 which does not cover the bond pads 112 or the ribbon structures 100 and 102.

Control and power signals are coupled to the MEMS package using conventional wire-bonding structures 116.

Unlike conventional semiconductor manufacturing techniques in which semiconductor elements are packed densely onto the upper surface of a semiconductor substrate, an optical glass is hermetically sealed directly onto the semiconductor substrate in the above-mentioned US patent. Thus, the bond pads 112 are spaced a considerable distance from the ribbon structures 100 and 102, so that a lid sealing region 118 is provided. A solderable material 120 is formed on the lid sealing region 118.

The hermetic lid 122, which is joined to the semiconductor substrate, is preferably formed of an optical quality material. Thus, the lid 122 can be used for a variety of purposes including filtering undesired radiation and enhancing or decreasing reflectivity.

The lid 122 may be also coated with an optically sensitive material to be used for other purposes without being limited to the above-mentioned purposes.

Once the lid 122 is formed to a size appropriate to fit concurrently over the lid sealing region 118, with a solderable material 124 formed in a ring surrounding the periphery of one surface of the lid 122, solder 126 is deposited onto the solderable material 124 so that the lid 122 is joined to the semiconductor substrate.

Though not shown to scale in the drawing, a significant space exists between the lid 122 and the ribbon structures 100 and 102 to prevent them from interfering with one another. Thus, the ribbon structures 100 and 102 are free to move upwards and downwards.

However, in the above-mentioned conventional technique of sealing the semiconductor elements in the above-mentioned MEMS package, the solder must be placed between the substrate and the lid and, thereafter, heat must be applied to the solder through a reflow process at a predetermined temperature so as to bond the lid to the substrate. Thus, the technique undesirably reduces the work speed, causing a reduction in productivity.

Another problem of the technique of sealing the semiconductor elements in the MEMS package is that it is impossible to execute a reworking process, such as for adding solder, even when the sealing is not complete due to inaccurate positioning of the solder and/or application of a deficient amount of solder to the junction between the substrate and the lid.

SUMMARY OF THE INVENTION

Accordingly, the present invention has been made keeping in mind the above problems occurring in the related art, and an object of the present invention is to provide an MEMS package, in which a metal sealing member is formed on a side surface of a lid that covers an MEMS element provided on a substrate, so that the metal sealing member hermetically seals the MEMS element from the external environment.

In order to achieve the above object, according to one aspect of the present invention, there is provided an MEMS package, comprising: a substrate, with an MEMS element provided on a surface of the substrate; a lid joined to the substrate such that the lid covers the MEMS element; a side sealing member provided on a side surface of the substrate and a surface of the lid, thus hermetically sealing the MEMS element from the external environment; and a metal sealing member made of metal, which completely covers both the side sealing member and the substrate having the MEMS element.

According to another aspect of the present invention, there is provided an MEMS package, comprising: an element substrate, with an MEMS element provided on a surface of the element substrate; a base substrate on which the element substrate is mounted; a lid joined to the element substrate such that the lid covers the MEMS element; a side sealing member provided on a surface of the base substrate and a side surface of a structure comprising both the element substrate and the lid, thus hermetically sealing the MEMS element from the external environment; and a metal sealing member made of metal, which completely covers both the side sealing member and the lid.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Below, an MEMS package having a metal sealing member according to the present invention will be described in detail with reference to the accompanying drawings.

Figure 1:
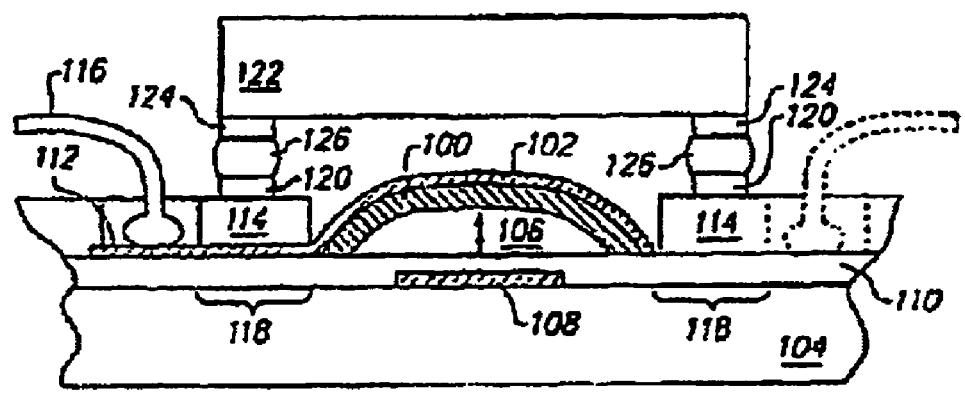
FIG. 1 is a sectional view illustrating the construction of an MEMS package according to a conventional technique.
Figure 2A:
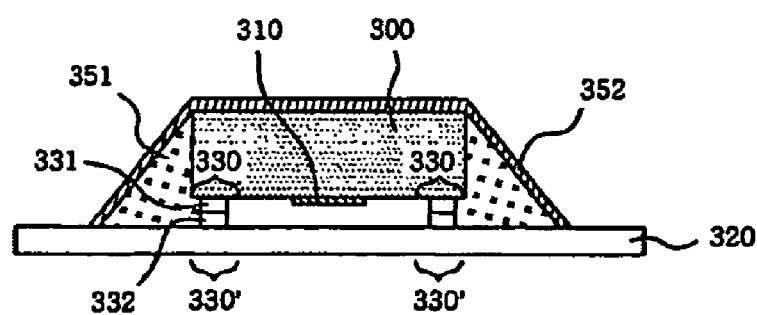
FIG. 2A is a sectional view illustrating the construction of an MEMS package having a metal sealing member according to a first embodiment of the present invention.

FIG. 2A is a sectional view illustrating the construction of an MEMS package having a metal sealing member according to a first embodiment of the present invention.

As shown in the drawing, the MEMS package having a metal sealing member according to the first embodiment of the present invention comprises a base substrate 300 on which an MEMS element 310 is provided, a lower bump 331, an upper bump 332, a lid glass 320, a side sealing member 351, and a metal sealing member 352.

In the first embodiment, the base substrate 300 may be a semiconductor substrate on which an MEMS element is formed, or a package module on which an MEMS element is mounted.

In that case, examples of MEMS elements 310 are diffractive, reflective or transmissive light modulating elements, optical elements or display elements used in a variety of optical devices, such as optical memory units, optical displays, printers, optical interconnections, and hologram displays.

The lower bump 331 is formed on a lid sealing region 330 of the base substrate 300. The upper bump 332 is formed on a lid sealing region 330' of the lid glass 320.

The lid glass 320 is joined to the base substrate 300 by means of the lower bump 331 and the upper bump 332, thus defining an air space which is an MEMS moving space in which the MEMS element 310 is free to move vertically.

The lid glass 320 may be coated on one or both sides thereof with an antireflective (AR) coating so that incident light transmissibility of the lid glass 320 can be enhanced.

The side sealing member 351 functions as a sealing means for sealing the MEMS element 310 provided on the base substrate 300 from the external environment. Thus, the side sealing member 351 is provided on a surface of the lid glass 320 and a side surface of the base substrate 300, and forms a flat surface which allows the metal sealing member 352 to be easily formed on the side sealing member 351 through a vapor deposition process. The side sealing member 351 has a solid and strong structure, but may not realize desired sealing efficiency, thus often failing to hermetically or reliably seal the MEMS element 310 from the external environment. Therefore, in the MEMS package according to the first embodiment of the present invention, the metal sealing member 352 is formed through one of a variety of deposition processes, such as a sputtering or vapor deposition process, so that the metal sealing member 352 completely covers the side sealing member 351 and the base substrate 300, and hermetically and reliably seals the MEMS element 310 from the external environment.

Figure 2B:
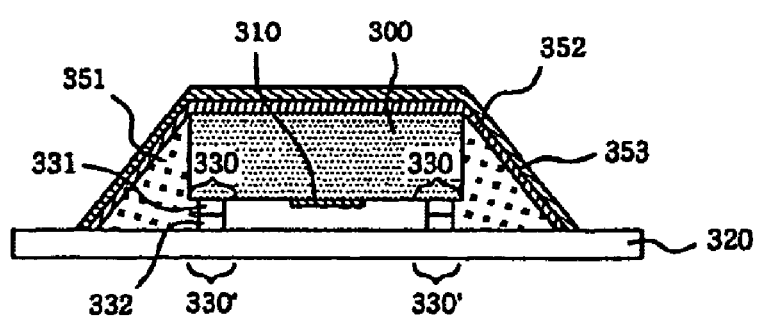
FIG. 2B is a sectional view illustrating the construction of an MEMS package having a metal sealing member according to a second embodiment of the present invention.

FIG. 2B is a sectional view illustrating the construction of an MEMS package having a metal sealing member according to a second embodiment of the present invention.

As shown in the drawing, the MEMS package having a metal sealing member according to the second embodiment of the present invention comprises a base substrate 300 on which an MEMS element 310 is provided, a lower bump 331, an upper bump 332, a lid glass 320, a side sealing member 351, a metal sealing member 352, and an external protective layer 353.

The base substrate 300 is a semiconductor substrate on which an MEMS element is formed. The lower bump 331 is formed on a lid sealing region 330 of the base substrate 300, while the upper bump 332 is formed on a lid sealing region 330' of the lid glass 320.

The lid glass 320 is joined to the base substrate 300 by means of the lower bump 331 and the upper bump 332, thus defining an air space which is an MEMS moving space in which the MEMS element 310 formed on the base substrate 300 is free to move vertically.

The side sealing member 351 functions as a sealing means for sealing the MEMS element 310, formed on the base substrate 300, from the external environment. Thus, the side sealing member 351 is provided on a surface of the lid glass 320 and a side surface of the base substrate 300, and forms a flat surface which allows the metal sealing member 352 to be easily formed on the side sealing member 351 through a vapor deposition process. The side sealing member 351 has a solid and strong structure, but may not realize desired sealing efficiency, thus often failing to hermetically or reliably seal the MEMS element 310 from the external environment. Therefore, in the MEMS package according to the second embodiment of the present invention, the metal sealing member 352 is formed through one of a variety of deposition processes, such as a sputtering or vapor deposition process, so that the metal sealing member 352 completely covers the side sealing member 351 and the base substrate 300, and hermetically and reliably seals the MEMS element 310 from the external environment.

Unlike the MEMS package according to the first embodiment, the MEMS package according to the second embodiment further comprises the external protective layer 353 which is formed on the metal sealing member 352 using a sealing material such that the layer 353 completely covers the metal sealing member 352 and protects the metal sealing member 352 from the external environment.

Figure 2C:
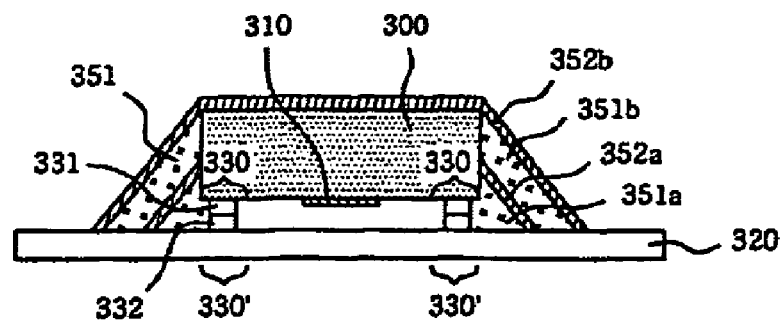
FIG. 2C is a sectional view illustrating the construction of an MEMS package having a metal sealing member according to a third embodiment of the present invention.

FIG. 2C is a sectional view illustrating the construction of an MEMS package having a metal sealing member according to a third embodiment of the present invention.

As shown in the drawing, the MEMS package having a metal sealing member according to the third embodiment of the present invention comprises a base substrate 300 on which an MEMS element 310 is provided, a lower bump 331, an upper bump 332, a lid glass 320, a first side sealing member 351*a*, a second side sealing member 351*b*, a first metal sealing member 352*a*, and a second metal sealing member 352*b*.

In the third embodiment, the base substrate 300 may be a semiconductor substrate on which an MEMS element is formed, or a package module on which an MEMS element is mounted.

In that case, examples of MEMS elements 310 are diffractive, reflective or transmissive light modulating elements, optical elements or display elements, used in a variety of optical devices, such as optical memory units, optical displays, printers, optical interconnections, and hologram displays.

The lower bump 331 is formed on a lid sealing region 330 of the base substrate 300, while the upper bump 332 is formed on a lid sealing region 330' of the lid glass 320.

The lid glass 320 is joined to the base substrate 300 by means of the lower bump 331 and the upper bump 332, thus defining an air space which is an MEMS moving space in which the MEMS element 310 is free to move vertically.

The first side sealing member 351*a* functions as a sealing means for sealing the MEMS element 310 provided on the base substrate 300 from the external environment. Thus, the first side sealing member 351*a* is provided on a surface of the lid glass 320 and a side surface of the base substrate 300, and forms a flat surface which allows the first metal sealing member 352*a* to be easily formed on the first side sealing member 351*a* through a vapor deposition process. The first side sealing member 351*a* has a solid and strong structure, but may not realize desired sealing efficiency, thus often failing to hermetically or reliably seal the MEMS element 310 from the external environment. Therefore, in the MEMS package according to the third embodiment of the present invention, the first metal sealing member 352*a* is formed through one of a variety of deposition processes, such as a sputtering or vapor deposition process, so that the first metal sealing member 352*a* completely covers the first side sealing member 351*a*, and hermetically and reliably seals the MEMS element 310 from the external environment.

Unlike the MEMS packages according to the first and second embodiments, each of the side sealing member and the metal sealing member in the MEMS package according to the third embodiment is configured as a multi-layered structure.

Described in detail, the first metal sealing member 352*a* is formed on the first side sealing member 351*a*. Thereafter, the second side sealing member 351*b* is formed on the first metal sealing member 352*a* using a sealing material. The second side sealing member 351*b* is configured such that the second side sealing member 351*b* protects the first metal sealing member 351*a* and allows the second metal sealing member 352*b* to be easily formed thereon.

After the second side sealing member 351*b* is formed on the first metal sealing member 352*a* as described above, the second metal sealing member 352*b* is formed such that the second metal sealing member 352*b* covers both the base substrate 300 and the second side sealing member 351*b*. Thus, the MEMS package according to the third embodiment hermetically and reliably seals the MEMS element 310 from the external environment.

In each of the first through third embodiments of the present invention, the MEMS element 310 is an optical element, so that the lid glass 320 is required. However, if the MEMS element is not an optical element, the lid glass may be replaced with a conventional substrate.

Figure 3A:
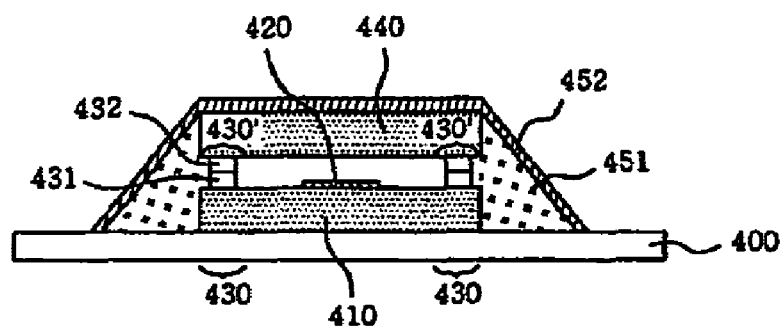
FIG. 3A is a sectional view illustrating the construction of an MEMS package having a metal sealing member according to a fourth embodiment of the present invention.

FIG. 3A is a sectional view illustrating the construction of an MEMS package having a metal sealing member according to a fourth embodiment of the present invention.

As shown in the drawing, the MEMS package having a metal sealing member according to the fourth embodiment of the present invention comprises a base substrate 400, an element substrate 410, an MEMS element 420, a lower bump 431, an upper bump 432, a lid 440, a side sealing member 451, and a metal sealing member 452.

In the fourth embodiment, the base substrate 400 is a conventional printed circuit board (PCB) to which the element substrate 410 provided with the MEMS element 420 thereon is mounted through a bonding process and which thus functions as a medium. The above-mentioned base substrate 400 is provided with a bond pad (not shown) to which a wire (not shown) to transceive electric signals to and from the outside of the package is connected.

The lower bump 431 is formed on a lid sealing region 430 of the element substrate 410. The upper bump 432 is formed on a lid sealing region 430' of the lid 440.

The element substrate 410 and the lid 440 are joined together by means of the lower bump 431 and the upper bump 432, thus defining an air space which is an MEMS moving space in which the MEMS element 420 is free to move vertically.

The side sealing member 451 functions as a sealing means for sealing a structure, comprising the lid 440 and the element substrate 410 provided with the MEMS element 420 thereon and mounted to the base substrate 400, from the external environment. Thus, the side sealing member 451 is provided on a surface of the base substrate 400 and a side surface of the structure which comprises the lid 440 and the element substrate 410 having the MEMS element 420. The side sealing member 451 has a solid and strong structure, but may not realize desired sealing efficiency, thus often failing to hermetically or reliably seal the structure from the external environment.

Therefore, in the MEMS package according to the fourth embodiment, the metal sealing member 452 is formed through a vapor deposition process so that the metal sealing member 452 completely covers the surface of the base substrate 400, a side surface of the side sealing member 451, and a surface of the lid 440. Thus, the metal sealing member 452 hermetically and reliably seals the MEMS element 420 from the external environment.

Figure 3B:
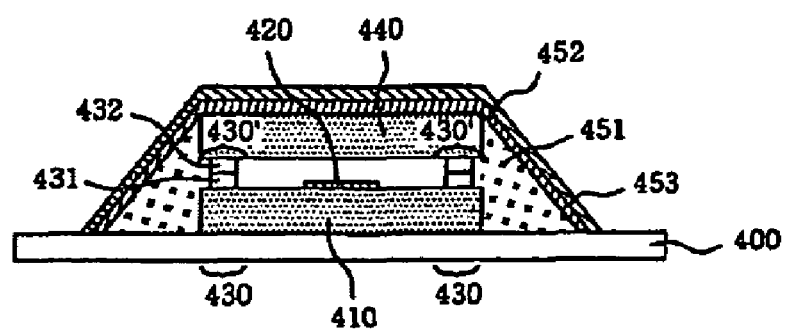
FIG. 3B is a sectional view illustrating the construction of an MEMS package having a metal sealing member according to a fifth embodiment of the present invention.

FIG. 3B is a sectional view illustrating the construction of an MEMS package having a metal sealing member according to a fifth embodiment of the present invention.

As shown in the drawing, the MEMS package having a metal sealing member according to the fifth embodiment of the present invention comprises a base substrate 400, an element substrate 410, an MEMS element 420, a lower bump 431, an upper bump 432, a lid 440, a side sealing member 451, a metal sealing member 452, and an external protective layer 453.

The general shape of the MEMS package according to the fifth embodiment remains the same as that described for the MEMS package according to the fourth embodiment. However, unlike the fourth embodiment, the fifth embodiment further comprises the external protective layer 453 which is formed on the metal sealing member 452 using a sealing material such that the layer 453 completely covers the metal sealing member 452 and protects the metal sealing member 452 from the external environment.

In the fourth and fifth embodiments of the present invention, each of the side sealing member and the metal sealing member in the MEMS package may be configured as a multi-layered structure in the same manner as that described for the third embodiment.

As is apparent from the above description, the MEMS package according to the present invention hermetically and reliably seals an MEMS element from the external environment using a metal sealing member.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A micro-electro-mechanical system (MEMS) package, comprising:
   a substrate, with a MEMS element provided on the substrate;
   a transparent lid joined to the substrate such that the lid covers the MEMS element;
   a spacer disposed between the substrate and the lid to space the lid from the substrate to define an interior space of a size sufficiently to permit operation of the MEMS element;
   a side sealing member disposed external to the interior space and disposed external to the transparent lid, said side sealing member disposed on a side surface of the substrate and on a surface of the lid, said side sealing member separate from the MEMS element and from the spacer is of a composition and configuration to hermetically seal the MEMS element from an external environment; and
   a metal sealing member made of metal, which substantially completely covers both the side sealing member and the substrate having the MEMS element.

2. A micro-electro-mechanical system (MEMS) package, comprising:
   a substrate, with a MEMS element provided on the substrate;
   a transparent lid joined to the substrate such that the lid covers the MEMS element;
   a spacer disposed between the substrate and the lid to space the lid from the substrate to define an interior space of a size sufficiently to permit operation of the MEMS element;
   a side sealing member external to the interior space provided on a side surface of the substrate and a surface of the lid, said side sealing member separate from the spacer is of a composition and configuration to hermetically seal the MEMS element from an external environment;
   a metal sealing member made of metal, which substantially completely covers both the side sealing member and the substrate having the MEMS element; and
   an inner metal sealing member provided within the side sealing member.

3. The MEMS package as set forth in claim 1, further comprising:
   an external protective layer substantially completely covering the metal sealing member and protecting the metal sealing member from the external environment.

4. A micro-electro-mechanical system (MEMS) package, comprising:
   an element substrate, with a MEMS element provided on a surface of the element substrate;
   a base substrate on which the element substrate is mounted;
   a lid positioned to cover the MEMS element;
   a spacer structure disposed between the element substrate and lid to position the lid in spaced relationship from the element substrate and to define an interior space within which the MEMS element is disposed;
   a side seal disposed external to the interior space and disposed external to the lid, said side seal structurally separate from the MEMS element and from the spacer structure and said side seal disposed on a surface of the base substrate and a side surface of both the element substrate and the lid, said side seal of a material composition and a configuration to hermetically seal the MEMS element from an external environment; and
   a metal sealing member made of metal, which substantially completely covers both the side seal and the lid.

5. A micro-electro-mechanical system (MEMS) package, comprising:
   an element substrate, with a MEMS element provided on a surface of the element substrate;
   a base substrate on which the element substrate is mounted;
   a lid positioned to cover the MEMS element;
   a spacer structure disposed between the element substrate and lid to position the lid in spaced relationship from the element substrate and to define an interior space within which the MEMS element is disposed;
   a side seal disposed external to the interior space and structurally separate from the spacer structure and disposed on a surface of the base substrate and a side surface of both the element substrate and the lid, said side seal of a material composition and a configuration to hermetically seal the MEMS element from an external environment;
   a metal sealing member made of metal, which substantially completely covers both the side seal and the lid; and an inner metal sealing member disposed within the side seal.

6. The MEMS package as set forth in claim 4, further comprising:
an external protective layer substantially covering the metal sealing member and protecting the metal sealing member from the external environment.

7. The MEMS package as set forth in claim 2, wherein the inner metal sealing member extends between a side surface of the substrate and a surface of the lid.

8. The MEMS package as set forth in claim 5, wherein the inner metal sealing member extends between a side surface with the lid and a surface of the bare substrate.

* * * * *